(12) United States Patent
Johnston et al.

(10) Patent No.: US 7,459,392 B2
(45) Date of Patent: Dec. 2, 2008

(54) NOBLE METAL BARRIER AND SEED LAYER FOR SEMICONDUCTORS

(75) Inventors: Steven W. Johnston, Portland, OR (US); Juan E. Dominguez, Hillsboro, OR (US); Michael L. McSwiney, Scappoose, OR (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 11/096,345

(22) Filed: Mar. 31, 2005

(65) Prior Publication Data
US 2006/0220249 A1    Oct. 5, 2006

(51) Int. Cl.
*H01L 21/768*  (2006.01)
(52) U.S. Cl. ............... 438/650; 438/643; 257/E21.584
(58) Field of Classification Search ........... 438/642, 438/650, 651
See application file for complete search history.

(56) References Cited

U.S. PATENT DOCUMENTS

| | | | |
|---|---|---|---|
| 6,436,816 B1 * | 8/2002 | Lee et al. | 438/643 |
| 6,632,737 B1 * | 10/2003 | Hillman et al. | 438/654 |
| 7,144,806 B1 * | 12/2006 | Fair et al. | 438/653 |
| 2003/0203617 A1 * | 10/2003 | Lane et al. | 438/627 |
| 2004/0009307 A1 * | 1/2004 | Koh et al. | 427/569 |
| 2004/0241321 A1 * | 12/2004 | Ganguli et al. | 427/255.28 |
| 2006/0063375 A1 * | 3/2006 | Sun et al. | 438/629 |

\* cited by examiner

*Primary Examiner*—Carl Whitehead, Jr.
*Assistant Examiner*—Jennifer M Dolan
(74) *Attorney, Agent, or Firm*—Blakely, Sokoloff, Taylor & Zafman LLP

(57) ABSTRACT

A barrier and seed layer for a semiconductor damascene process is described. The seed layer is formed from a noble metal with an intermediate region between the barrier and noble metal layers to prevent oxidation of the barrier layer.

9 Claims, 6 Drawing Sheets

NOBLE METAL BARRIER AND SEED LAYER FOR SEMICONDUCTORS

FIELD OF THE INVENTION

The invention relates to the formation of barrier and seed layers in semiconductor processing such as is used in a damascene process.

PRIOR ART AND RELATED ART

Some thin metal films have been identified as permitting the direct plating of copper without the forming of a separate seed layer. For instance, a diffusion barrier of a noble metal may be formed over an interlayer dielectric (ILD) or over a barrier layer formed on the ILD. See "Forming a Copper Diffusion Barrier," publication number US 2004/0084773. Also see "Forming a Combined Copper Diffusion Barrier and Seed Layer," application Ser. No. 10/943,359, filed Sep. 17, 2004, assigned to the assignee of the present application. When the noble metal is formed on a refractory metal barrier such as Ta, Ti or W, oxygen used as a reactant in the formation of the noble metal, may form an oxide which decreases the barrier's effectiveness.

Additionally, in a typical formation of, for instance, a Ta barrier, amine groups are used which are typically reduced with ammonia. This results in resist poisoning due to nitrogen absorption into the ILD material and outgassing during patterning of the next metal layer.

DETAILED DESCRIPTION

A method for forming barrier and seed regions or layers in a semiconductor device is described. In the following description, numerous specific details are set forth such as specific materials. It will be apparent to one skilled in the art that the present invention may be practiced without these specific details. In other instance, well-known processing such as associated with chemical vapor deposition (CVD), atomic layer deposition (ALD), or hybrid-ALD/CVD deposition is not described in detail, in order not to unnecessarily obscure the present invention.

Figure 1:
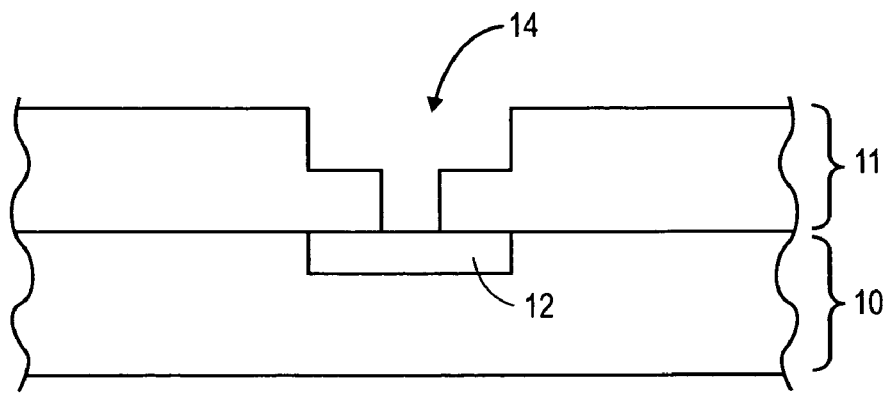
FIG. 1 is a cross-sectional, elevation view showing a first ILD layer with a conductor and a second ILD layer with a conductor and via opening.

Referring first to FIG. 1, an ILD layer 10 is shown with a conductor 12 formed therein. The ILD layer 10 and conductor 12 may be a typical damascene or dual damascene structure. An ILD 11 is shown formed on the ILD 10 with an opening 14 defined through the ILD 11 exposing the underlying conductor 12. The opening 14 includes a via opening which exposes the conductor 12 and a larger overlying trench in which a conductor is subsequently formed. The ILDs 10 and 11 may be any one of numerous well-known dielectric materials, including low-k materials, such as a polymer-based or carbon-doped silicon dioxide dielectric.

Figure 2:
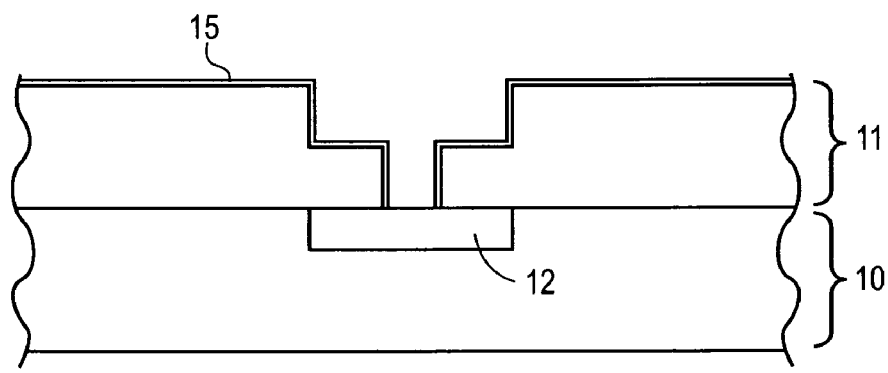
FIG. 2 shows the structure of FIG. 1 with a barrier layer.

As shown in FIG. 2, a barrier layer 15 is formed within the opening 14 and covers the upper surface of the ILD 11. The barrier layer 15 may be one of several commonly used barrier materials such as tantalum, tantalum compound, titanium, titanium compound, tungsten, or tungsten compound. The layer 15 may be formed using well-known CVD, ALD, or hybrid CVD/ALD deposition processes.

In one embodiment, an organometallic precursor is used to form the layer 15 to prevent resist poisoning by eliminating or minimizing the use of a nitrogen containing ligands. Such precursors can be reduced with hydrogen as opposed to ammonia thereby eliminating the nitrogen poisoning. In particular, tantalum deposition using CVD, ALD, or plasma-enhanced CVD or a low pressure CVD is used. The resultant tantalum film may be a relatively pure tantalum metal, tantalum nitride, tantalum carbide, tantalum silicide, tantalum silicon nitride, tantalum silicon carbide, tantalum oxide, tantalum oxynitride, tantalum oxycarbide, tantalum silicate, or combinations thereof.

The precursors shown in FIGS. 8-14 can be reduced using hydrogen, silane, or hydrocarbons. These tantalum-containing precursors may be delivered with any one of many well-known technologies for precursor delivery. Volatile solids and liquid precursors can simply use vapor draw at elevated temperatures. Volatile liquids can also be bubbled. Any liquid precursors may be delivered via direct liquid injection. Involatile solid precursors can be dissolved in an appropriate solvent (such as toluene or other hydrocarbons) and delivered via direct liquid injection.

Figure 8:
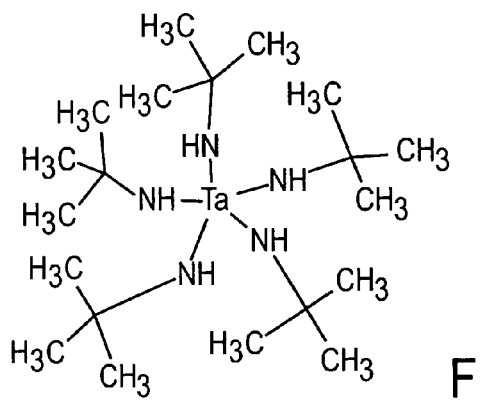
FIG. 8 illustrates a tantalum amide precursor.

A first compound is pentakis(t-butyl amino) tantalum as shown in FIG. 8. The t-butyl amino group is an effective leaving group and reduces the amount of free amine/nitrogen in the final film as compared to amines with smaller hydrocarbon moieties.

Figure 9:
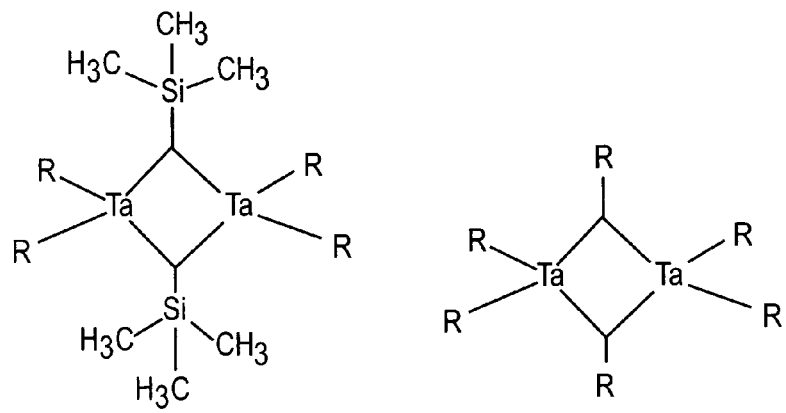
FIG. 9 illustrates a dimetallacyclobutadiene precursor.

A second class of compounds is dimetallacyclobutadiene precursors based on tantalum as shown in FIG. 9. These precursors contain two tantalum and two carbon atoms in a four membered ring with the general formula $Ta_2C_2R_6$ where R is any ligand including but not limited to H, alkyl, arlyl, polycyclic aryl, amine, alkoxide, silyl, siloxyl, phosphine, polycyclic, or heteronuclear polycyclic. Common ligands include silyl groups on the carbon atoms and methylcyclopentadienyl and carbazoles on the tantalum atoms.

Figure 10:
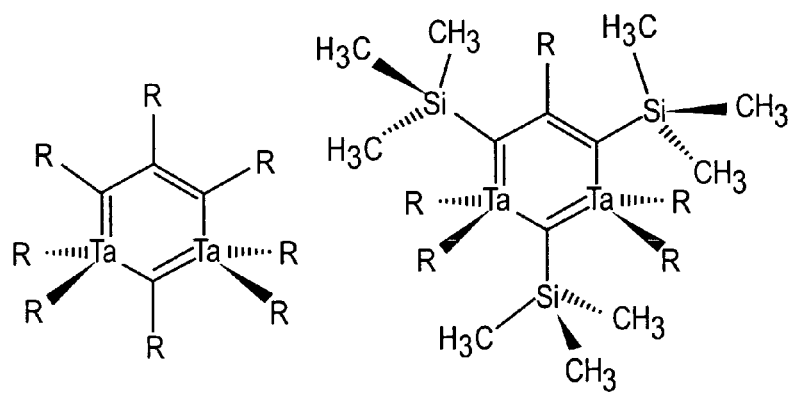
FIG. 10 illustrates a dimetallabenzene precursor.

A third class of compounds is closely related to the dimetallacyclobutadiene precursors detailed above. FIG. 10 shows this class of compounds based on tantalum versions of 1,3-dimetallabenzene with the general formula $Ta_2C_4R_8$ where R is any ligand including but not limited to H, alkyl, aryl, polycyclic aryl, amine, alkoxide, silyl, siloxyl, phosphine, polycyclic, or heteronuclear polycyclic. Common ligands found include silyl groups on the carbon atoms and methyl-cyclopentadienyl and carbazoles on the tantalum atoms.

Figure 11:
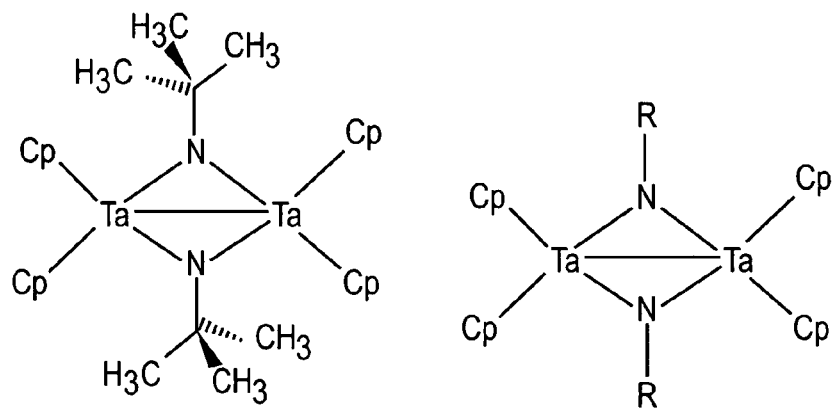
FIG. 11 illustrates a tantalocene imido complex.

A fourth class of compounds are tantalum imido complexes as shown in FIG. 11 with the general formula $Ta_2N_2R_6$ where R is any ligand including but not limited to H, alkyl, aryl, amine, alkoxide, silyl, siloxyl, phosphine, polycyclic, or heteronuclear polycyclic. Common ligands found include aryl groups on the nitrogen atoms (such as a t-butyl group) and cyclic aryl groups on the tantalum atoms.

Figure 12:
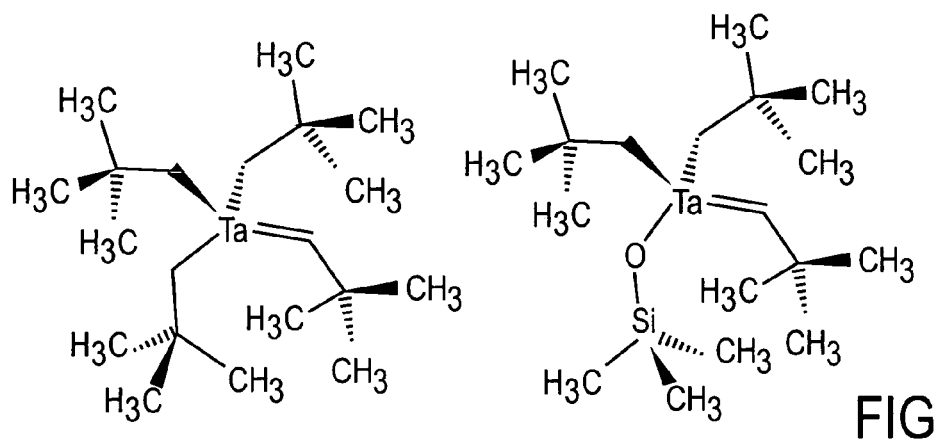
FIG. 12 illustrates a tantalum carbene complex.

FIG. 12 shows another class of compounds—tantalum carbene complexes with the general formula $TaR_4$. These compounds are characterized by a tantalum doubly bonded to a carbon aryl group as one of the four R groups. The other four R groups can be any ligand including but not limited to H, alkyl, aryl, polycyclic aryl, amine, alkoxide, silyl, siloxyl, phophine, polycyclic, or heteronuclear polycyclic, but alkyl and siloxyl groups are best known.

Figure 13:
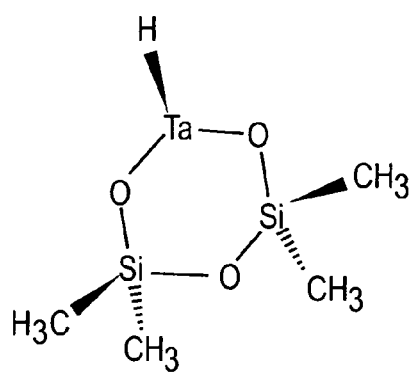
FIG. 13 illustrates a tantalum siloxy hydride complex.

FIG. 13 shows a cyclic tantalum siloxyl hydride complex that would be primarily useful for making tantalum silicates.

Figure 14:
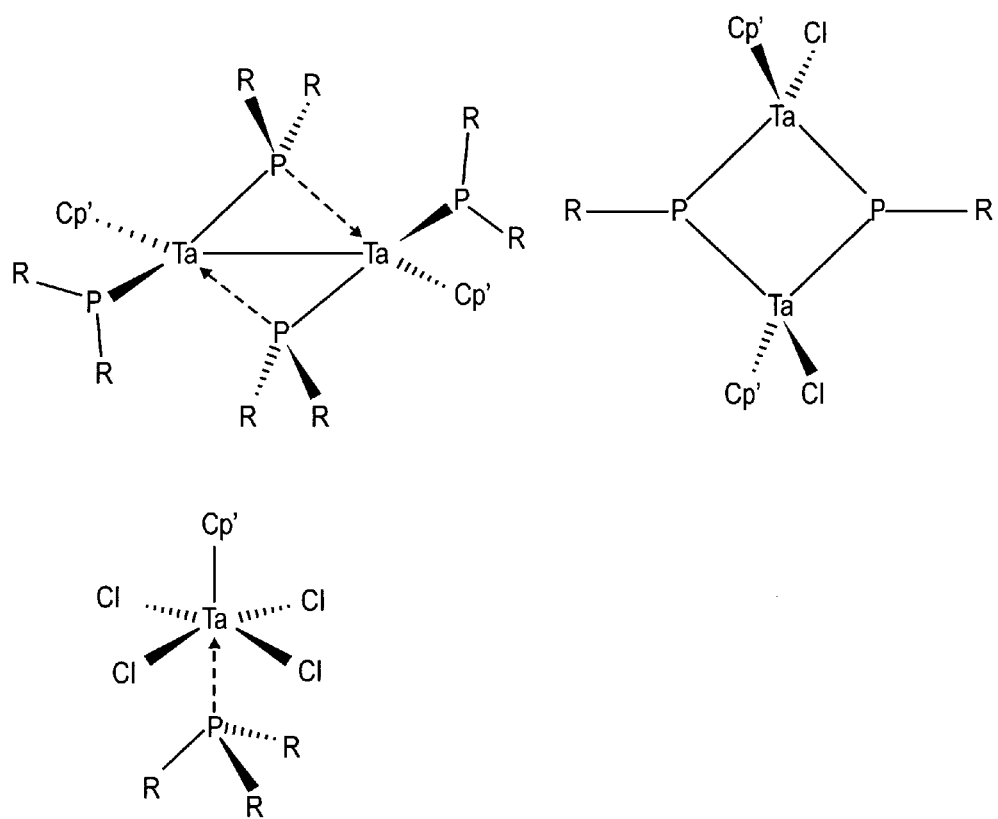
FIG. 14 illustrates tantalum phosphine, phosphanido, and phosphnidene complexes.

Finally, FIG. 14 shows the class of compounds that are useful for depositing the films as detailed above, compounds with phosphorus ligand complex including phosphine, phosphanido, and phosphnidene complexes. These have the general formulas $TaR_2(PR_2)_4$, $TaR_2X_2(PR)_2$ and $TaRX_4PR_3$ where X is any halogen and R is any ligand including but not limited to H, alkyl, aryl, polycyclic aryl, amine, alkoxide, silyl, siloxyl, phosphine, polycyclic, or heteronuclear polycyclic. In all cases for all compounds, the R groups need not be the same for the molecule. Each molecule can have a combination of R groups.

Figure 3:
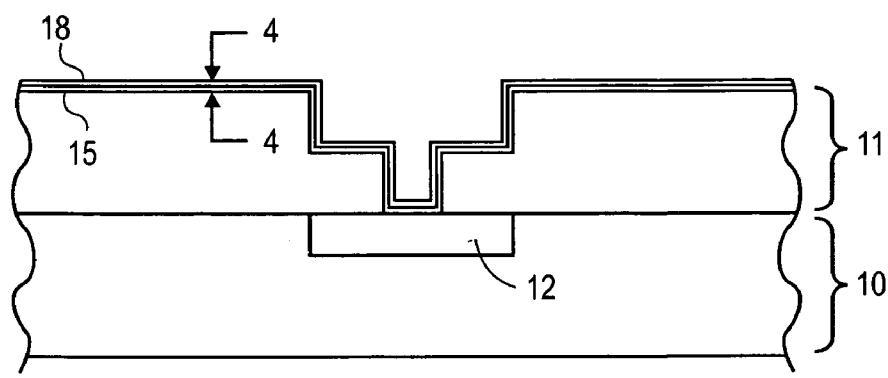
FIG. 3 shows the structure of FIG. 2 with a noble metal layer formed on the barrier layer.
Figure 4:
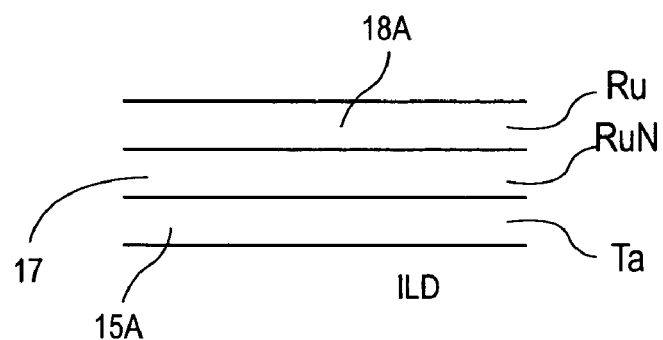
FIG. 4 is an exploded view of the barrier layer and noble metal layer and the intermediate region between the layers.

As shown in FIG. 3, a noble metal layer 18 is formed on the barrier layer 15. (Noble metals, as used herein, include the metals in the platinum group (Ru, Ir, Pd, Pt, and Os)). In FIG. 4, a more detailed look at the intermediate region formed between the barrier layer and the overlying noble layer is shown for a tantalum barrier layer 15A, and a noble metal Ru layer 18A. The intermediate region 17 comprises RuN for this example. It will be appreciated that the barrier layer may be any of the previously described barrier materials. As will be described below, the intermediate region may be a carbide or nitride region or carbon nitride derivative which acts as a buffer, prevents oxidation of the underlying barrier material during oxygen pulses used to deposit the noble metal and improves interface adhesion.

As mentioned earlier, a conventional ALD process may be used to deposit the barrier layer using a conventional ALD precursor, or with the concurrent use of carbon-containing reactants, such as $CH_4$ to create nitrides and carbon nitride derivatives. Alternatively, the precursors discussed in conjunction with FIGS. 8-14 may be used to provide a relatively N-free barrier layer.

Figure 7:
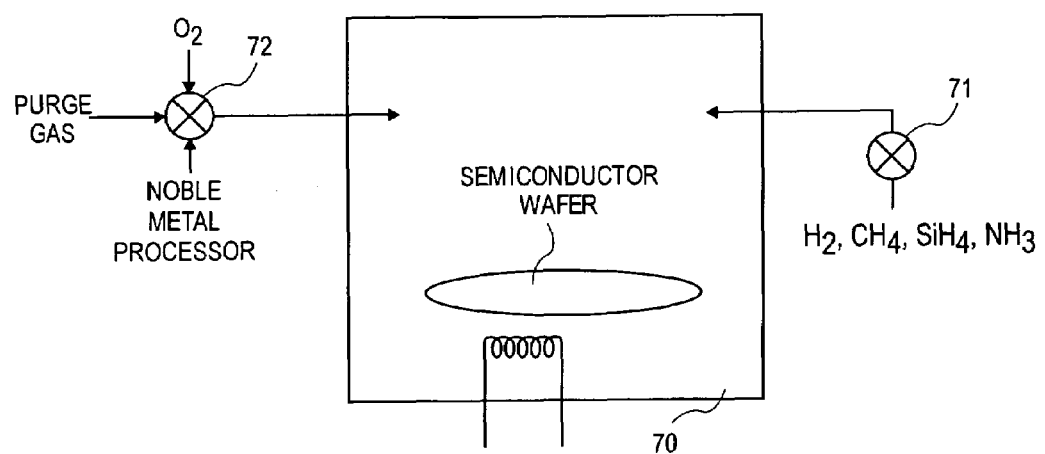
FIG. 7 illustrates a deposition chamber used for depositing the noble metal layer and the intermediate region between the noble metal layer and the underlying barrier layer.

Then, a noble metal precursor (such as $Ru(Cp)_2$) is pulsed into a chamber such as chamber 70 of FIG. 7. In a subsequent step, molecules such as $H_2$, $CH_4$, $SiH_4$, $NH_3$, a hydrocarbon such as methane, ethane or propane, or a combination thereof are introduced as shown by valve 71 which results in a noble metal carbide, nitride, silicide or a combination of these. In another embodiment, Ru or other noble metal precursors containing nitrogen such as $RuL_y(NZ3)_x$ is used where L is a ligand directly attached to the metal such as carbonyl, arene, alkyl or silyl ligand and Z is a molecule attached to the unprotected N such as $CH_2$ (alkyls) or H. Such molecules can be deposited in reducing, non-oxygen containing conditions and result directly in carbided or nitrided noble metal films, without the use of further reaction steps.

A noble metal is now deposited using oxidizing conditions to form a relatively pure metal with low impurity levels and high conductivity. Alternate pulses of a noble metal precursor and oxygen are introduced as shown by valve 72 of FIG. 7. Purging, with an inert gas such as argon, occurs between the pulses. Such process sequence will retain the good diffusion barrier performance of the refractory metal based barrier and prevent possible adhesion issues due to film oxidation. To minimize line resistance and facilitate gapfill in narrow features, the thicknesses of the layers should be very thin and likely deposited by ALD or a highly conformal CVD process. Ideally, the intermediate region is 10-25 Å thick and the noble metal thickness is 100 Å or less. Alternatively, the noble layer can be deposited with an appropriate noble metal precursor and a reduction agent containing hydrogen.

The deposition of noble metals using physical vapor deposition, CVD, and ALD is well known. For example the deposition of ruthenium is described in Y. Matsui et al., Electro. And Solid-State Letters, 5, C18 (2002) using Ru(EtCp)2. The use of [RuC5H5(CO)2]2,3 to deposit ruthenium is described in K. C. Smith et al., Thin Solid Films, v376, p. 73 (November 2000). The use of Ru-tetramethylhentane dionate and Ru(CO)6 to deposit ruthenium is described in http://thinfilm.snu.ac.kr/research/electrode.htm. The deposition of rhodium is described in A. Etspuler and H. Suhr, Appl. Phys. A, vA48, p. 373 (1989) using dicarbonyl (2,4-pentanedionato) rhodium-(I).

The deposition of molybdenum is described in K. A. Gesheva and V. Abrosimova, Bulg. J. of Phys., v19, p. 78 (1992) using Mo(Co)6. The deposition of molybdenum using MoF6 is described in D. W. Woodruff and R. A. Sanchez-Martinez, Proc. of the 1986 Workshop of the Mater. Res. Soc., p. 207 (1987). The deposition of osmium is described in Y. Senzaki et al., Proc. of the 14.sup.th Inter. Conf. And EUROCVD-11, p. 933 (1997) using Os(hexafluoro-2-butyne)(CO)4. The deposition of palladium is described in V. Bhaskaran, Chem. Vap. Dep., v3, p. 85 (1997) using 1,1,1,5,5,5-hexafluoro-2,4-pentanedionato palladium(II) and in E. Feurer and H. Suhr, Tin Solid Films, v157, p. 81 (1988) using allylcyclopentadienyl palladium complex.

The deposition of platinum is described in M. J. Rand, J. Electro. Soc., v122, p. 811 (1975) and J. M. Morabito and M. J. Rand, Thin Solid Films, v22, p.293 (1974) using Pt(PF3)4) and in the Journal of the Korean Physical Society, Vol. 33, November 1998, pp. S148-S151 using ((MeCp)PtMe.sub.3) and in Z. Xue, H. Thridandam, H. D. Kaesz, and R. F. Hicks, Chem. Mater. 1992, 4, 162 using ((MeCp)PtMe.sub.3).

The deposition of gold is described in H. Uchida et al., Gas Phase and Surf. Chem. of Electro. Mater. Proc. Symp., p. 293 (1994) and H. Sugawara et al., Nucl. Instrum. and Methods in Physics Res., Section A, v228, p. 549 (1985) using dimethyl (1,1,1,5,5,5-hexafluoroaminopenten-2-on-ato)Au(III). The deposition of iridium has been described using (Cyclooctadiene) Iridium (hexafluoroacetylacetonate). Noble metals may be plated directly on tantalum nitride using two-step plating processes involving a basic electroplating bath copper seed plating followed by acidic electroplating bath copper bulk plating.

Figure 5:
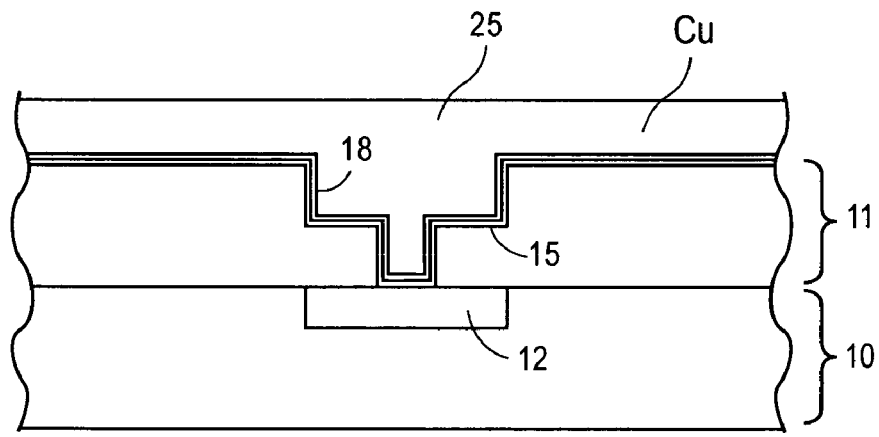
FIG. 5 shows the structure of FIG. 3 after copper has been plated onto the structure.
Figure 6:
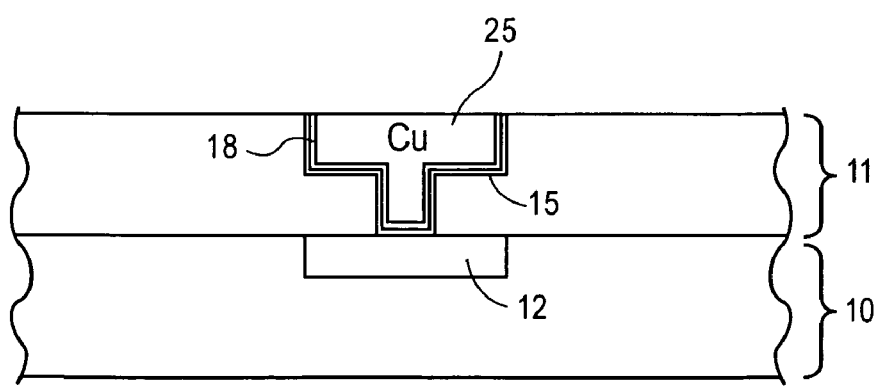
FIG. 6 shows the structure of FIG. 5 following planarization.

As shown in FIG. 5, a conductive metal layer, such as copper layer 25, is plated directly onto the noble metal layer 18. Layer 18 has sufficient conductivity to permit this. Next as shown in FIG. 6, planarization occurs such as with chemical mechanical polishing to define the conductors in the ILD 11. A capping layer may now be selectively deposited over the copper where desired.

Thus, a method of forming barrier and seed layers using a noble layer has been described.

What is claimed is:

1. A method in the fabrication of a semiconductor device comprising:

forming, on an inter-layer dielectric (ILD) layer, a barrier layer with a precursor which is reduced with a nitrogen-free gas; and, without adding nitrogen to the barrier layer, forming an intermediate noble metal carbide, noble metal nitride or noble metal silicide region on the barrier layer using a noble metal precursor and a reactant, wherein the barrier layer protects the ILD layer from the reactant; and forming a noble metal layer on the intermediate noble metal carbide, noble metal nitride or noble metal silicide region.

2. The method defined by claim 1, wherein the reactant is selected from the group consisting of $H_2$, $NH_3$, $SiH_4$ and hydrocarbons.

3. The method defined by claim 1, wherein the noble metal precursor is also used for forming the noble metal layer.

4. The method defined by claim 1, wherein forming the noble metal layer comprises atomic layer deposition (ALD) including the introduction of the noble metal precursor followed by the introduction of an oxygen containing gas.

5. The method defined by claim 1, wherein the noble metal layer formation comprises ALD using a noble metal precursor which is reduced with hydrogen.

6. The method defined claim 1, wherein forming the barrier layer comprises the use of hydrogen gas to reduce a barrier layer metal precursor.

7. The method defined by claim 6, wherein the barrier layer metal precursor is a tantalum containing precursor selected from a group consisting of pentakis (t-butyl amino) tantalum, dimetallacyclobutadiene, 1,3-dimetallabenzene, tantalum imido complexes, tantalum carbene complexes, cyclic tantalum siloxyl hydride complex, and phosphorus ligand complex.

8. A method for forming a barrier and seed layer comprising:

introducing into a chamber a barrier metal precursor and a first reactant which is nitrogen-free to form a nitrogen-free barrier layer; and, without adding nitrogen, introducing into the chamber a first noble metal precursor and a second reactant so as to produce a noble metal carbide, a noble metal nitride or a noble metal silicide region on the nitrogen-free barrier layer; and introducing a second noble metal precursor into the chamber so as to form a noble metal layer on the noble metal carbide, the noble metal nitride or the noble metal silicide region.

9. The method defined by claim 8, wherein the second reactant is selected from the group consisting of $H_2$, $SiH_4$, $NH_3$ and hydrocarbons.

* * * * *